United States Patent
Wang

(10) Patent No.: US 8,796,866 B2
(45) Date of Patent: Aug. 5, 2014

(54) MICRO-ELECTROMECHANICAL PRESSURE SENSOR HAVING REDUCED THERMALLY-INDUCED STRESS

(71) Applicant: Continental Automotive Systems, Inc., Auburn Hills, MI (US)

(72) Inventor: Joe Pin Wang, Long Grove, IL (US)

(73) Assignee: Continential Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 13/652,739

(22) Filed: Oct. 16, 2012

(65) Prior Publication Data

US 2014/0103468 A1    Apr. 17, 2014

(51) Int. Cl.
| | |
|---|---|
| H01L 23/48 | (2006.01) |
| H01L 23/52 | (2006.01) |
| H01L 29/40 | (2006.01) |
| H01L 23/28 | (2006.01) |
| H01L 23/12 | (2006.01) |

(52) U.S. Cl.
USPC ........... 257/783; 257/786; 257/787; 257/731; 257/747

(58) Field of Classification Search
USPC .......... 257/782, 783, 786, 419, 787, 731, 747
See application file for complete search history.

(56) References Cited

U.S. PATENT DOCUMENTS

| | | | | |
|---|---|---|---|---|
| 5,948,991 | A | * | 9/1999 | Nomura et al. .................. 73/727 |
| 5,967,921 | A | * | 10/1999 | Simpson et al. .............. 474/110 |
| 6,227,055 | B1 | | 5/2001 | Pitzer |
| 6,441,499 | B1 | * | 8/2002 | Nagarajan et al. ............ 257/780 |
| 7,647,833 | B1 | | 1/2010 | Oboodi et al. |
| 7,779,701 | B2 | | 8/2010 | DiPaolo et al. |
| 2004/0016995 | A1 | * | 1/2004 | Kuo et al. ..................... 257/678 |
| 2008/0087095 | A1 | | 4/2008 | Fukuda et al. |
| 2008/0277747 | A1 | | 11/2008 | Ahmad |
| 2010/0044809 | A1 | | 2/2010 | Dangtran et al. |

OTHER PUBLICATIONS

Search Report dated Jun. 12 2013, from corresponding GB Patent Application No. GB1306840.8.

* cited by examiner

Primary Examiner — Matthew Reames
Assistant Examiner — Dilinh Nguyen

(57) ABSTRACT

Thermally-induced stress on a silicon micro-electromechanical pressure transducer (MEMS sensor) is reduced by attaching the MEMS sensor to a plastic filled with low $C_{TE}$ fillers that lowers the plastic's coefficient of thermal expansion ($C_{TE}$) to be closer to that of silicon. The MEMS sensor is attached to the housing using an epoxy adhesive/silica filler mixture, which when cured has a $C_{TE}$ between about ten PPM/° C. and about thirty PPM/° C. in order to match the housing $C_{TE}$. The adhesive also has a glass transition temperature (Tg) above the operating temperature range. This design provides good sealing of the sensor and stable sensor outputs.

4 Claims, 2 Drawing Sheets

MICRO-ELECTROMECHANICAL PRESSURE SENSOR HAVING REDUCED THERMALLY-INDUCED STRESS

BACKGROUND

Micro-electromechanical pressure sensor systems (MEMS) are well known. They are formed of a thin silicon diaphragm supported by a relatively thick, relatively massive substrate. The diaphragm flexes responsive to pressure applied to the diaphragm through a port. A piezo-resistive Wheatstone bridge circuit formed into the diaphragm, changes its resistance responsive to diaphragm deflection.

MEMS sensors are usually attached to a surface of a housing or substrate that is to be attached to a component of a vehicle and used to sense various pressures. MEMS sensors are typically fixedly attached to housing in order to be made operable. The die on which the MEMS sensor is formed, also seals the pressure port and should have enough strength to prevent bursting.

There is usually a large difference between the thermal expansion coefficient ($C_{TE}$) of a MEMS device and the housing for the MEMS device, whether it is plastic or ceramic. When the MEMS device and housing are bonded together with an adhesive, the bonding stress induced by the $C_{TE}$ differences can affect the MEMS output.

Low modulus silicone is widely used to reduce bonding stress for low pressure sensors, which also should be able to prevent bursting when subjected to three or more times the maximum operating pressure. Low modulus die bonding material, however, is usually weak and therefore not well-suited for use with medium pressure sensors, e.g., transmission fluid pressure sensors, engine oil sensors, and the like. A stronger bonding material is needed for medium pressure sensors. But the bonding stress typically increases with their usually higher moduli. Increasing a bonding area can increase a bond's strength, however, increasing the bonding area is often not practical or feasible due to the fact that the size of MEMS sensors are shrinking for at least cost-reduction reasons (or physical constraints for packaging). Bonding stress and bonding strength therefore should be carefully considered. Matching the thermal expansion coefficients of a silicon MEMS sensor device and the use of lower modulus polymer based housing and a mounting adhesive would be an improvement over the prior art.

BRIEF SUMMARY

Thermally-induced stress on a silicon micro-electromechanical pressure transducer (MEMS sensor) is reduced by attaching the MEMS sensor to a plastic filled with low $C_{TE}$ fillers that lowers the plastic's coefficient of thermal expansion ($C_{TE}$) to be closer to that of silicon. The MEMS sensor is attached to the housing using an epoxy adhesive/silica filler mixture, which when cured has a $C_{TE}$ between about ten PPM/° C. and about thirty PPM/° C. in order to match the housing $C_{TE}$. The adhesive also has a glass transition temperature (Tg) above the operating temperature range. This design provides good sealing of the sensor and stable sensor outputs.

DETAILED DESCRIPTION

Figure 1:
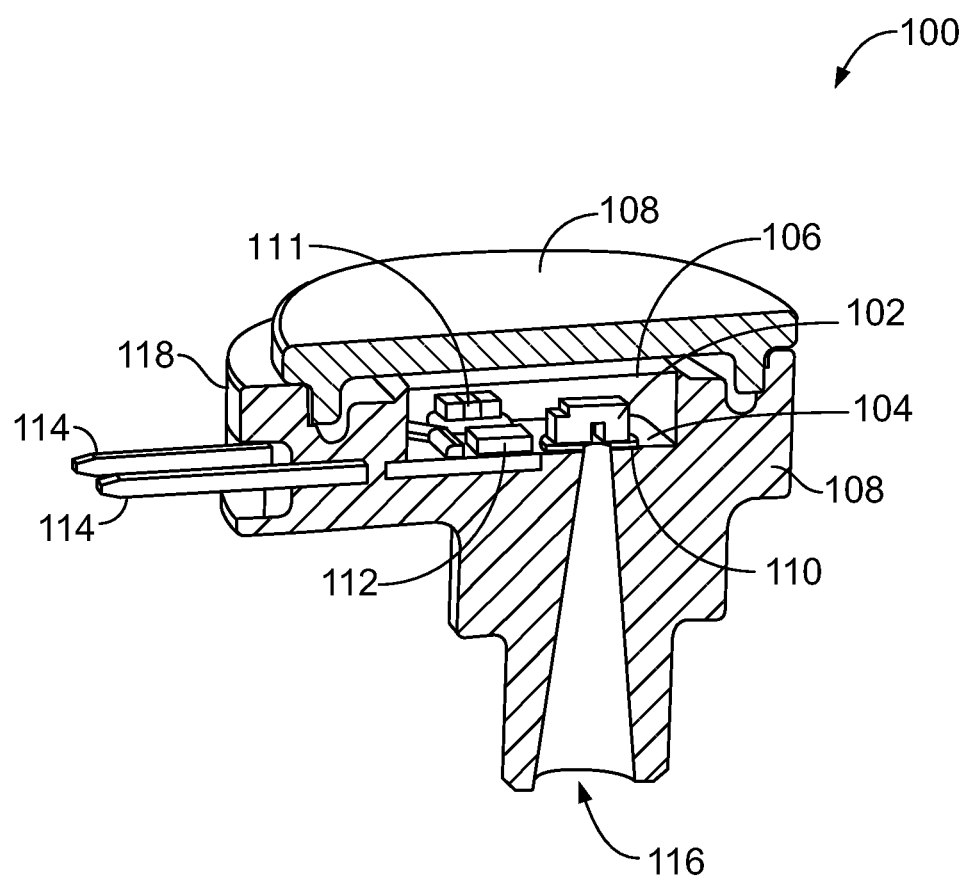
FIG. 1 is a cut-away view of a medium-pressure MEMS sensor.

FIG. 1 is a cut-away view of a pressure sensor 100 configured to be able transduce pressures between about 10 bar and about 70 bar into measurable electrical signals. The sensor 100 includes a conventional micro-electromechanical pressure sensor 102 formed of silicon. A base or cap made from glass or silicon can be added. Because it is silicon, the MEMS sensor 102 has a relatively low coefficient of thermal expansion $C_{TE}$ that is between about one (1) part per million per degree Celsius and about five (5) parts per million per degree Celsius The silicon MEMS sensor 102 is mounted to a relatively flat mounting surface 104 located inside a cavity 106 formed inside a housing 108 made of a plastics such as polyphenylene sulfide (PPS), Liquid Crystal Polymer (LCP) thermal plastics or thermal set epoxies. The sensor 102 is held in place on the mounting surface 104 by a polymer-based adhesive 110 such as epoxy or Bismaleimide (BMI).

The cavity 106 is protected by a cover 108. Other electronic devices 111, 112 in the cavity 104 can be accessed via signals carried on electrically conductive signal leads 114 that extend through the side wall 118 of the housing 108. A pressure port 116 that extends through the housing 108 is formed to allow fluids, i.e., liquids and gases, to exert a pressure or vacuum on a thin diaphragm in the MEMS sensor 102.

As stated above, silicon has a $C_{TE}$ between about one (1) part per million per degree Celsius (PPM/° C.) and about five (5) parts per million per degree Celsius (PPM/° C.). The housing plastics have their own, nominal coefficients of thermal expansion $C_{TE}$ that are significantly greater than the $C_{TE}$ of silicon. Polymer-based adhesives also have their own $C_{TE}$ which are different from the $C_{TE}$ of silicon and the $C_{TE}$ of plastic.

Different thermal expansion coefficients of the silicon, plastic housing, and the die bond adhesive all contribute to the bonding thermal stress, which is created due to different $C_{TE}$.

The thermal expansion coefficients of a plastic housing and the thermal expansion coefficient of polymer based adhesive can be lowered to match the silicon's by mixing the plastic and adhesive with low $C_{TE}$ fillers. Some thermal plastics, such as LCP, could have a relatively low $C_{TE}$ to begin with but are still relatively high when compared to the $C_{TE}$ of silicon.

In a preferred embodiment, the plastic housing 108 is made of polyphenylene sulfide or PPS, mixed with glass and mineral fillers. PPS resin has a $C_{TE}$ around 50 PPM/° C. The filler should therefore have a $C_{TE}$ much less than the $C_{TE}$ of PPS.

The amount of filler that should be added to an amount of PPS in order to produce a thermal plastic having a $C_{TE}$ closer to the $C_{TE}$ of silicon is determined experimentally and measured by weight. In a preferred embodiment, the amount of filler added to PPS in order to yield a thermal plastic having a $C_{TE}$ between about 10 PPM/° C. and about 30 PPM/° C. was determined to be about sixty percent (60%) of the weight of the mixture of PPS and filler, i.e., about 60% of the weight of the housing is filler; about 40% of the housing's weight is PPS.

Epoxy also has a significantly higher $C_{TE}$ than the $C_{TE}$ of silicon. The $C_{TE}$ of the epoxy adhesive is lowered in the same way that the $C_{TE}$ of PPS is lowered. In an embodiment, the silicon MEMS sensor is held in place on a thermal plastic mounting surface 104 using an organic, epoxy adhesive 110 having a $C_{TE}$ between about 10 PPM/° C. and about 30 PPM/° C. The $C_{TE}$ of the epoxy 110 is reduced by mixing the epoxy 110, with low $C_{TE}$ fillers such as silica. The percentage or amount of filler content that is to be added to a particular adhesive in order to adjust the $C_{TE}$ of the adhesive to "match" the $C_{TE}$ of a housing/MEMS device will of course vary with a particular adhesive. In a preferred embodiment using epoxy, the epoxy has about 65% filler.

It is also important that the adhesive used with a pressure sensor/pressure transducer have a glass transition temperature, Tg, above the sensor's operating temperature upper limit. In general, 20-25° C. higher than the maximum operating temperature, i.e., the upper limit, will avoid non-linear material property changes that could affect MEMS sensor outputs. The epoxy 110 therefore preferably has a glass transition temperature, Tg, of at least one hundred seventy degrees Celsius (170° C.) for the application of sensing pressures at temperatures up to about 150° C.

Figure 2:
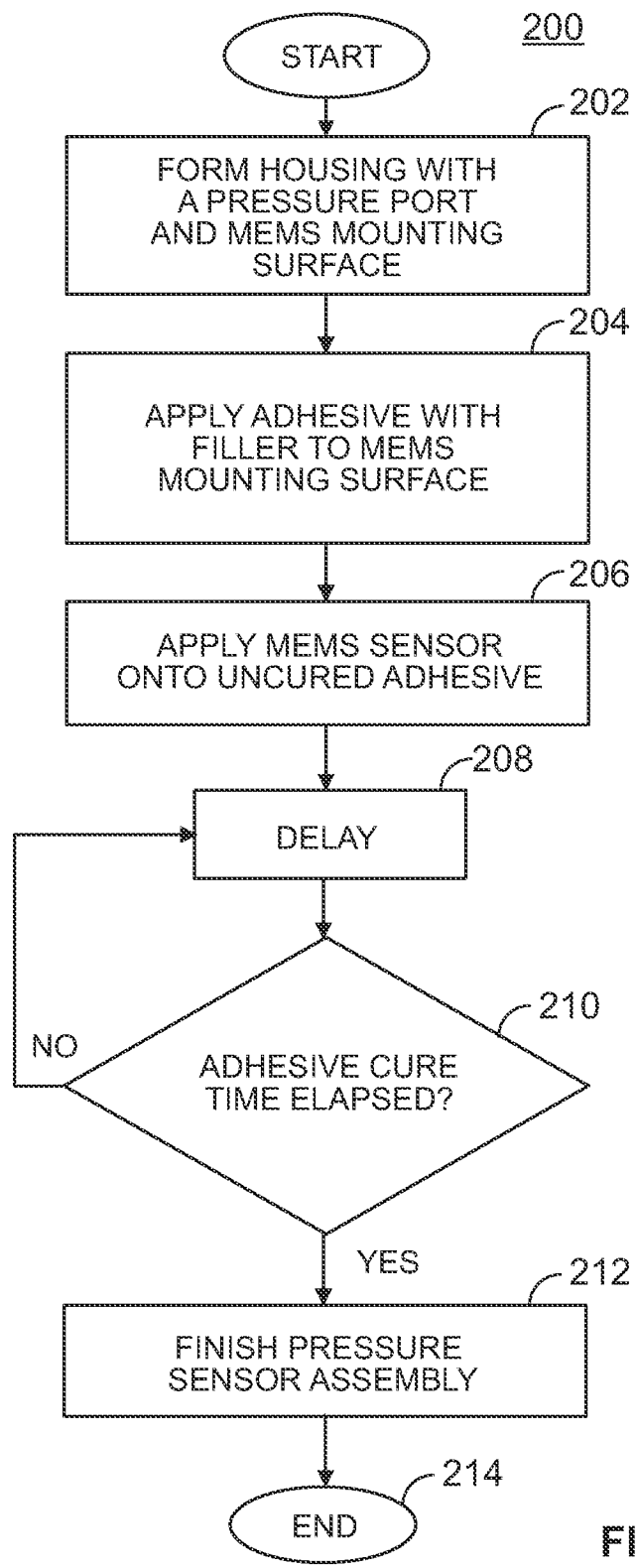
FIG. 2 is a diagram showing steps of a method of forming the sensor shown in FIG. 1.

The pressure sensor shown in FIG. 1 may be formed using a method depicted in FIG. 2.

At a first step 202, the housing 108 is formed by molding a mixture of thermal plastic, such as PPS, mixed with a predetermined amount of filler, typically about 60% to 65% of the weight of the mixture, such that the amount of filler is sufficient to provide the resulting plastic with a $C_{TE}$ of about 10 to about 30 PPM/° C.

At a second step 204, an epoxy adhesive mixed with a predetermined amount of silica filler is applied to a MEMS mounting surface 104 inside the cavity 106 of a plastic housing 108.

Epoxy takes time to cure. The method 200 thus includes a delay loop 208 and 210, which is repeated until the time required for the epoxy to cure has elapsed. When the epoxy cure time has elapsed at step 210, the rest of the pressure sensor assembly can be completed at step 212.

The foregoing description is for illustration. The true scope of the invention is set forth in the following claims.

The invention claimed is:

1. A pressure sensor comprising:
a micro-electromechanical pressure transducer (MEMS sensor) formed from silicon and comprising a diaphragm, the MEMS sensor having a coefficient of thermal expansion ($C_{TE}$) between about 1 part per million (PPM) per degree Celsius (/° C.) and about 5 PPM/° C.;
a plastic housing formed from first amount of polyphenylene sulfide (PPS) and a second amount of a filler comprising glass and a mineral, the plastic housing having a weight, about forty-percent of which is PPS, about sixty-percent of which is the filler, the plastic housing comprising a mounting surface for the MEMS sensor and having a pressure port configured to permit fluid to apply pressure to the diaphragm, the amount of PPS and the amount of fillers being selected such that the plastic housing has a coefficient of thermal expansion between about ten (10) parts per million (PPM) per degree Celsius (/° C.) and about thirty (30) PPM/° C.; and
an adhesive comprising a first amount of an organic epoxy mixed with a second amount of a mineral filler, about sixty-five percent of the adhesive weight being the mineral filler such that the adhesive has a $C_{TE}$ between about ten PPM/° C.) and about thirty PPM/° C., the adhesive being located between the mounting surface and the MEMS sensor thereby attaching the MEMS sensor to the mounting surface.

2. The pressure sensor of claim 1, wherein the adhesive comprises an organic epoxy having a $C_{TE}$ between about nineteen PPM/° C. and about twenty-four PPM/° C. and further having a glass transition temperature ($T_g$) of at least one hundred seventy degrees Celsius (170° C.), and wherein the mineral filler comprises a predetermined amount of silica, the organic epoxy being mixed with the predetermined amount of the silica filler to form a mixture of epoxy and silica filler.

3. The pressure sensor of claim 2, wherein the predetermined amount of silica filler is between about fifty percent and about eighty percent of the weight of the mixture.

4. The pressure sensor of claim 2, wherein the predetermined amount of silica filler is about sixty-five percent of the weight of the mixture of adhesive and filler.

* * * * *